United States Patent [19]
Ishida

[11] Patent Number: 5,966,605
[45] Date of Patent: Oct. 12, 1999

[54] REDUCTION OF POLY DEPLETION IN SEMICONDUCTOR INTEGRATED CIRCUITS

[75] Inventor: Emi Ishida, Sunnyvale, Calif.

[73] Assignee: Advanced Micro Devices, Inc., Sunnyvale, Calif.

[21] Appl. No.: 08/966,308

[22] Filed: Nov. 7, 1997

[51] Int. Cl.[6] .................................................. H01L 21/336
[52] U.S. Cl. ........................ 438/299; 438/308; 438/530; 438/558; 438/585
[58] Field of Search .................................... 438/299, 301, 438/303, 308, 530, 532, 558, 585; 148/DIG. 90, DIG. 91

[56] References Cited

U.S. PATENT DOCUMENTS

| | | | |
|---|---|---|---|
| 4,502,205 | 3/1985 | Yahano | 438/530 |
| 4,586,064 | 4/1986 | Esser et al. | 257/340 |
| 4,635,347 | 1/1987 | Lien et al. | 438/301 |
| 5,258,095 | 11/1993 | Nagata et al. | 216/67 |
| 5,399,506 | 3/1995 | Tsukamoto | 438/308 |
| 5,541,138 | 7/1996 | Yamazaki et al. | 438/535 |
| 5,569,624 | 10/1996 | Weiner | 438/285 |
| 5,597,746 | 1/1997 | Prall | 438/300 |
| 5,602,410 | 2/1997 | Schwalke et al. | 257/401 |
| 5,612,253 | 3/1997 | Farahani et al. | 438/643 |
| 5,817,536 | 10/1998 | Nayak et al. | 438/530 |

FOREIGN PATENT DOCUMENTS

| | | | |
|---|---|---|---|
| 8-148680 | 6/1996 | Japan | 148/DIG. 90 |

OTHER PUBLICATIONS

"Kinetics and nucleation model of the C49 to C54 phase transformation in TiSi$_2$ thin films on deep–sub–micron n$^+$ type polycrystalline silicon lines", J.A. Kittl, D.A. Prinhslow, P. P. Apte and M. F. Pas, *1995 American Institute of Physics,* Appl. Phys. Lett. 67(16), Oct. 16, 1995, pp. 2308–2310.

*Primary Examiner*—Michael Trinh
*Attorney, Agent, or Firm*—Amin & Eschweiler, LLP

[57] ABSTRACT

A method of forming a transistor includes the steps of forming a gate structure (56) overlying a gate oxide layer (54), wherein the gate structure (56) and gate oxide layer (54) overlie a substrate (50), thereby separating the substrate (50) into a first region (90) and a second region (92) with a channel region therebetween. The method also includes doping the gate structure (56), the first region (90) and the second region (92) and annealing the doped gate structure (56) with a laser anneal, thereby driving the dopant through a substantial depth of the gate structure (56). Lastly, a source region (94) and a drain region (96) are formed in the first region (90) and the second region (92), respectively, wherein the dopant is further driven into the gate structure (56). Consequently, the dopant is driven substantially deeper in the gate structure (56) than in the shallow source region (94) and drain region (96) junctions to allow decoupling of poly depletion from the need for shallow junctions.

17 Claims, 4 Drawing Sheets

REDUCTION OF POLY DEPLETION IN SEMICONDUCTOR INTEGRATED CIRCUITS

TECHNICAL FIELD

The present invention generally relates to integrated circuits and, in particular, to a method for reducing poly-depletion in MOSFET structures.

BACKGROUND ART

Field-effect transistors (FETs) and other related insulated-gate electronic devices are mainstay components of MOS integrated circuits. A MOSFET generally consists of two closely spaced, doped regions in a substrate—the source and the drain. The region between the two is the channel above which a thin insulation layer is formed. A gate electrode is formed directly over and completely covering the insulation layer directly above the channel and a voltage applied to the gate affects the electronic properties of the channel region, whereby the MOSFET is turned on and off.

The abbreviation MOS (metal oxide semiconductor) has become somewhat of a misnomer because for many applications the gate is formed of a polysilicon material which is doped to render it conductive. One problem that is encountered as ultra-shallow junction depths are pursued to reduce transistor sizing stems from the poly gate thickness not being scaled down at the same rate as the source/drain regions. Consequently, this scaling discrepancy leads to poly-depletion. As is commonly understood by those skilled in the art, poly depletion occurs when an anneal subsequent to the doping of the poly gate 18 is insufficient to drive the implanted impurities down the entire depth of the poly gate 18 as illustrated in prior art FIG. 1. Consequently, a portion 20 of the poly gate 18 nearest a gate oxide 22 is depleted of impurities and behaves as an insulating region. As a result, the transistor behaves as though the gate oxide 22 is substantially thicker, thereby resulting in a substantial degradation of device performance or even rendering the device inoperable. Increasing the implant energy or subsequent anneal time to remedy the poly depletion created another problem; namely it causes the shallow source/drain regions 24 and 26 to increase in depth. Consequently, a process designer faces a performance trade-off between reduced poly depletion and shallow source/drain junctions.

Another problem associated with the simultaneous processing of the gate with the source and drain regions involves the use of laser annealing. Laser annealing is a process by which a laser beam is radiated onto a wafer in a pulsed mode to anneal various semiconductor regions. Unfortunately, the laser energy required to melt (and thereby activate) the source/drain regions is higher than the energy needed to melt the polysilicon gate; therefore the energy required to form the source/drain regions causes excessive melting of the polysilicon gate which results in degraded oxide quality and, in some cases, poly gate destruction.

One prior art solution to the above problem involves the addition of an amorphizing implant such as silicon or germanium to reduce the melting temperature of the poly gate 18 and source/drains 24 and 26. The goal of this process was to stay below the melting temperature of the polycrystalline, but above the melting temperature of the amorphized region which allowed for melting of the poly gate 18 and the source/drain regions 24 and 26 without melting through the entire thickness of the poly gate 18. Unfortunately, this prior art process solution adds process steps and causes increased defects, thereby resulting in increased leakage and enhanced diffusion.

Accordingly, there is a need in the art for the elimination of poly depletion without negatively impacting the formation of shallow source/drain regions.

SUMMARY OF THE INVENTION

According to one aspect of the present invention, a method of eliminating poly depletion without negatively impacting shallow source/drain junctions is disclosed. Dopants are introduced into both the polysilicon gate and the source/drain regions of the substrate. The polysilicon gate is then annealed with a laser anneal process at an energy sufficient to melt the polysilicon while not melting the source/drain regions. Subsequently, the source/drain regions are annealed to form shallow source/drain junctions. Consequently, the laser anneal process provides a substantial amount of dopant diffusion in the polysilicon gate without negatively impacting the source/drain regions. The subsequent anneal for the source/drain regions provides further poly diffusion, thereby eliminating both poly depletion and the design trade-off between poly depletion and shallow source/drain junctions.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DISCLOSURE OF INVENTION

Figure 1:
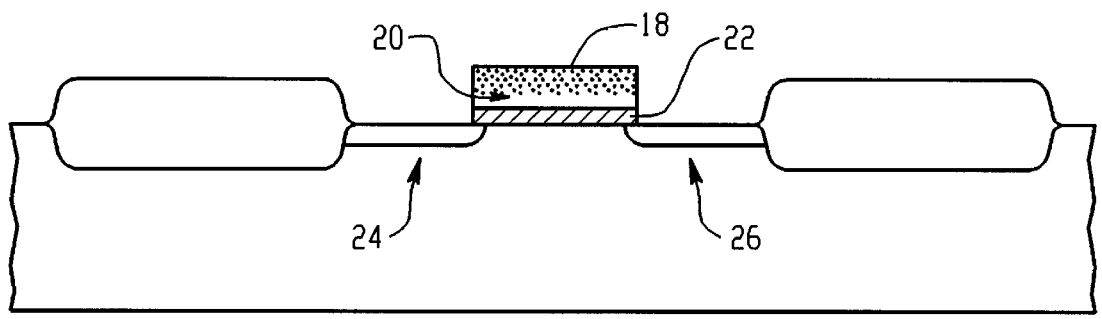
FIG. 1 is a cross-section diagram illustrating a prior art process, whereby a source, drain and gate are simultaneously exposed to a rapid thermal anneal.

The present invention will now be described with reference to the drawings, wherein like reference numerals are used to refer to like elements throughout. According to one embodiment of the present invention, an annealing step in forming the source/drain regions is decoupled from the annealing of the doped poly gate to eliminate the trade-off between poly depletion and shallow source/drain regions. A laser annealing process is used to anneal the poly gate to drive the impurities through a substantial depth of the poly gate without causing diffusion in the source/drain regions. The laser process operates with nanosecond pulses at an energy level sufficient to melt the poly gate without melting the source/drain regions. Use of the laser annealing process allows for low thermal budgets and low implantation energies for source/drain formation, thereby allowing for the optimization of the poly gate doping without detrimentally impacting shallow source/drain junction formation.

Figure 2A:
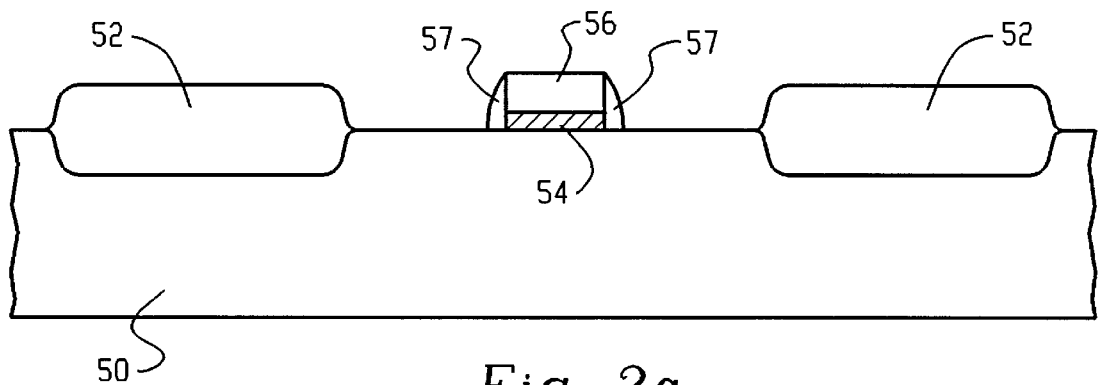
FIGS. 2a–2h are cross-section diagrams which illustrate the steps of eliminating poly depletion without negatively impacting shallow source/drain regions according to one embodiment of the invention.

Referring initially to FIG. 2a, the process according to a first embodiment of the present invention begins with a commercially available silicon wafer which defines a silicon substrate 50 for the integrated circuit being fabricated. Before forming the source/drain regions and doping the polysilicon gate, the circuit components are constructed within and on the substrate 50 in accordance with well-known integrated circuit fabrication techniques. The details of the common steps are discussed in detail in many common references such as, for example, VLSI Technology, by S. M. Sze, 2nd Edition (McGraw-Hill Publishing Co.). Consequently, the formation of these common steps will be discussed only briefly.

FIG. 2a illustrates a substrate 50 after the completion of several steps prior to forming the source and drain regions of a MOSFET. These preparatory steps are accomplished generally as follows. To form the isolation, one method first includes forming a silicon dioxide layer by thermal oxidation of the substrate 50 in an oxidizing atmosphere at an elevated temperature. The thickness is not critical and is often in the range of about 200 to 1,000 Angstroms. A layer of silicon nitride is then formed, usually by chemical vapor deposition (CVD). A common photoresist mask technique is then used to create a pattern in the silicon nitride. Finally, thick isolating regions 52 are then grown after which the silicon nitride and silicon oxide layers are removed. Next, a gate oxide layer 54 is formed by thermal growth, followed by a polysilicon gate 56 which is formed by a CVD process (such as, for example, an atmospheric pressure CVD, a low-pressure CVD or plasma-enhanced CVD) and patterned via a standard etch process (a dry, anisotropic etch process is preferred). Sidewall spacers 57 are then formed via, for example, a CVD oxide deposition followed by a directional etching such as, for example, reactive ion etching (RIE).

Figure 2B:
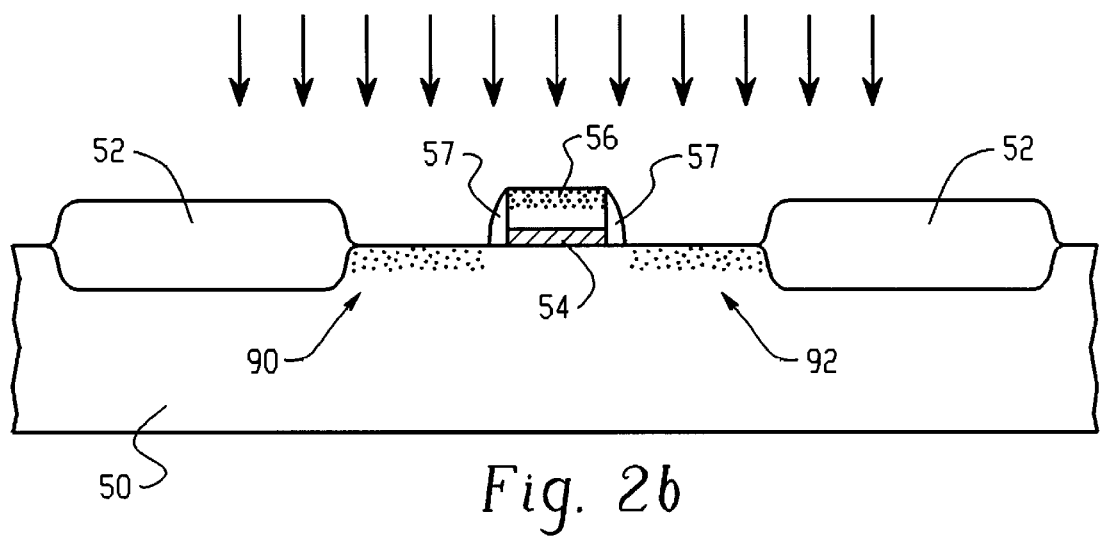

Subsequent processing according to the present invention follows in accordance with FIGS. 2b–2h. After formation of the polysilicon gate 56, the substrate 50 is subjected to a dopant via, for example, ion implantation to dope the polysilicon gate 56 and the substrate to form unactivated source and drain regions 90 and 92 and an unactivated polysilicon gate 56 as represented in FIG. 2b. If ion implantation is utilized for this step, a preferred range is an impurity dose of about $1 \times 10^{14}$–$1 \times 10^{15}$ ions/cm$^2$ and an implantation energy of about 1 to 20 keV.

Figure 2C:
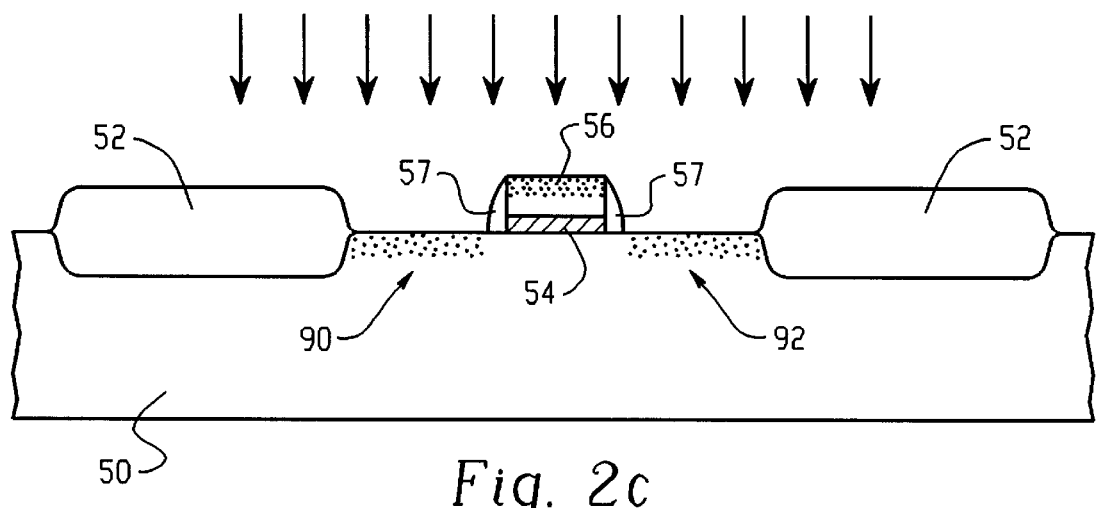

After doping the poly gate 56, a laser anneal step is used to anneal the doped poly gate 56, as illustrated in FIG. 2c, thereby driving the impurity ions to a desired depth in the poly. Laser annealing is the preferred method for annealing because the laser energy may be set at a level that is high enough to melt the poly gate 56, but is not high enough to melt the unactivated source and drain regions 90 and 92 (for example, a laser fluence of about 600–900 mJ/cm$^2$). Note that the impurity ions are preferably not driven down the entire depth of the poly because the poly gate 56 will be exposed to subsequent thermal processing during the formation of the source/drain regions and therefore the impurity ions will further diffuse. The laser anneal step, does, however, provide a substantial amount of poly diffusion without it impacting the unactivated source and drain regions 90 and 92.

Figure 2D:
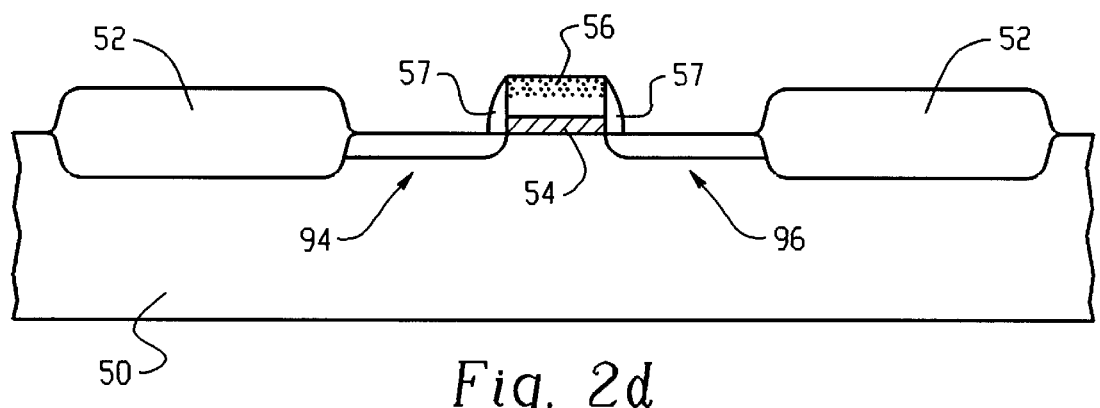

After the poly gate anneal is completed, a standard RTA is performed to activate the unactivated source and drain regions 90 and 92 and perform additional impurity diffusion in the poly gate 56, thereby forming a shallow junction source region 94 and drain region 96, as illustrated in FIG. 2d. The RTA also causes the impurities to diffuse through the entire depth of the poly, thereby eliminating poly depletion.

By decoupling the annealing of the unactivated source region 90 and the drain region 92 from the primary annealing of the poly gate 56, shallow source/drain junctions 94 and 96 can be formed with low thermal budgets (providing for the shallow source/drain formation) without causing poly depletion.

In the first embodiment, the gate 56 was laser annealed prior to annealing the unactivated source and drain regions 90 and 92. Alternatively, however, the unactivated regions 90 and 92 (and gate 56) may be annealed first with an RTA, followed by a laser anneal of the gate 56. In either case, laser annealing the gate 56 does not impact the source and drain regions, thereby eliminating poly gate depletion without negatively impacting the desired shallow source/drain junction formation. Consequently, the prior art design trade-off between poly depletion and shallow junction formation is eliminated with the present invention.

Standard fabrication techniques can next be used to deposit remaining layers necessary to finalize the particular integrated circuit device, such as source, drain and gate contacts, further insulation, metallization, and passivation layers. The resulting structure has shallow source/drain regions which are necessary for small device geometries without poly depletion.

Figure 2E:
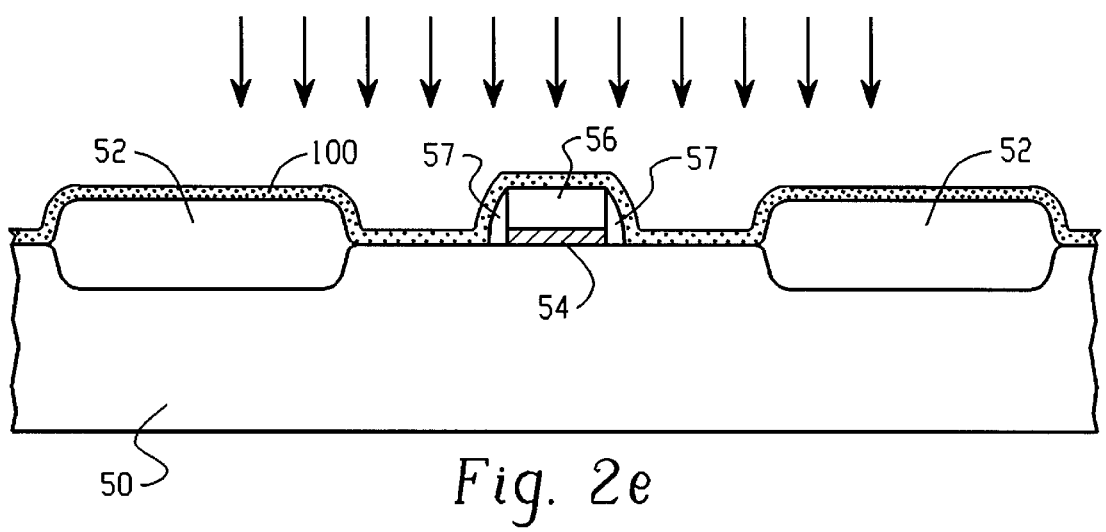

According to another embodiment of the present invention, instead of doping the polysilicon gate 56 via ion implantation as illustrated in FIG. 2b, the polysilicon gate 56 may be doped using a projection gas immersion laser doping process (P-GILD). Conventionally in P-GILD, a dopant is deposited over the surface of the wafer (often referred to as a pre-deposition) using a photolytic decomposition of dopants from the gas phase, thereby forming a layer 100 over the substrate 50 and the polysilicon gate 56, as illustrated in FIG. 2e.

A laser anneal step is then employed in a manner similar to the anneal of FIG. 2c. In particular, the laser anneal is performed at a laser energy that is large enough to melt the poly gate 56 and initiate diffusion of the dopant from the layer 100 into the poly gate 56. The laser energy level, however, is not sufficient to cause diffusion of dopant into the substrate 50. Consequently a substantial portion of the poly anneal is decoupled from the formation of the source/drain regions. As in the previous embodiment, it is preferable that the dopant not be driven down the entire depth of the poly because the poly gate 56 will be exposed to subsequent thermal processing. Consequently, the aggregate thermal treatment will result in the dopant being driven through the entire depth of the poly, thereby eliminating poly depletion.

Figure 2F:
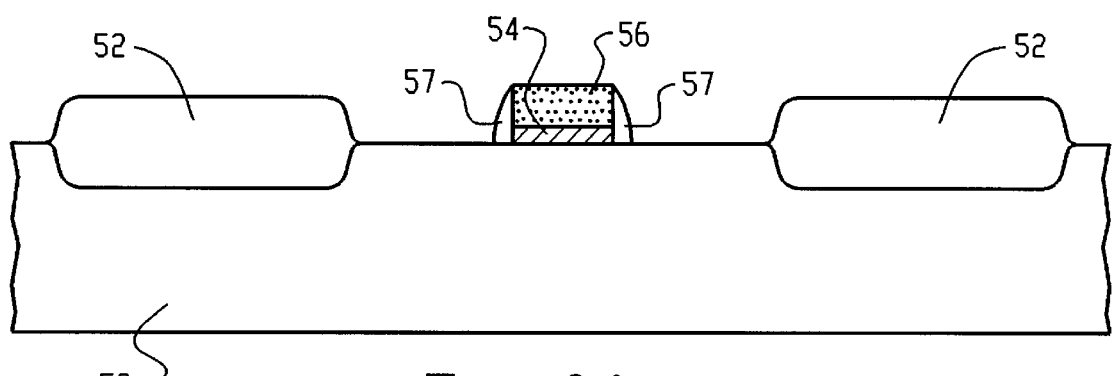
Figure 2G:
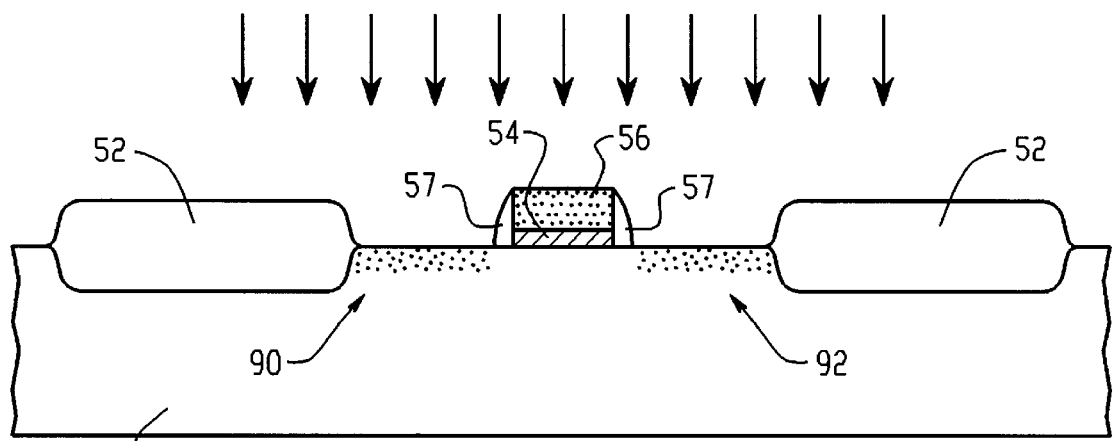

After the laser anneal, the wafer is washed (with, for example, an RCA clean) to thereby remove the dopant layer 100 from the surface, thereby resulting in a structure as illustrated in FIG. 2f. Subsequently, an ion implantation step is utilized to form unactivated source and drain regions 90 and 92 as illustrated in FIG. 2g. A standard RTA step then follows to activate the unactivated source and drain regions and perform additional dopant diffusion in the poly gate 56, thereby resulting in a structure as illustrated in FIG. 2h, whereby poly gate depletion is eliminated without negatively impacting the desired shallow source/drain junction formation.

As in the previous embodiment, standard fabrication techniques can next be used to deposit remaining layers necessary to finalize the particular integrated circuit device, such as source, drain and gate contacts, further insulation, metallization, and passivation layers. The resulting structure has shallow source/drain regions which are necessary for small device geometries without poly depletions.

Figure 2H:
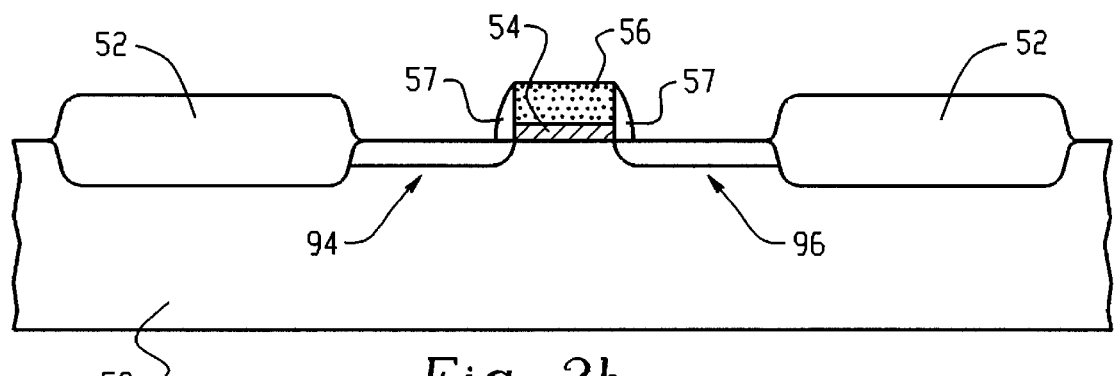
Figure 3:
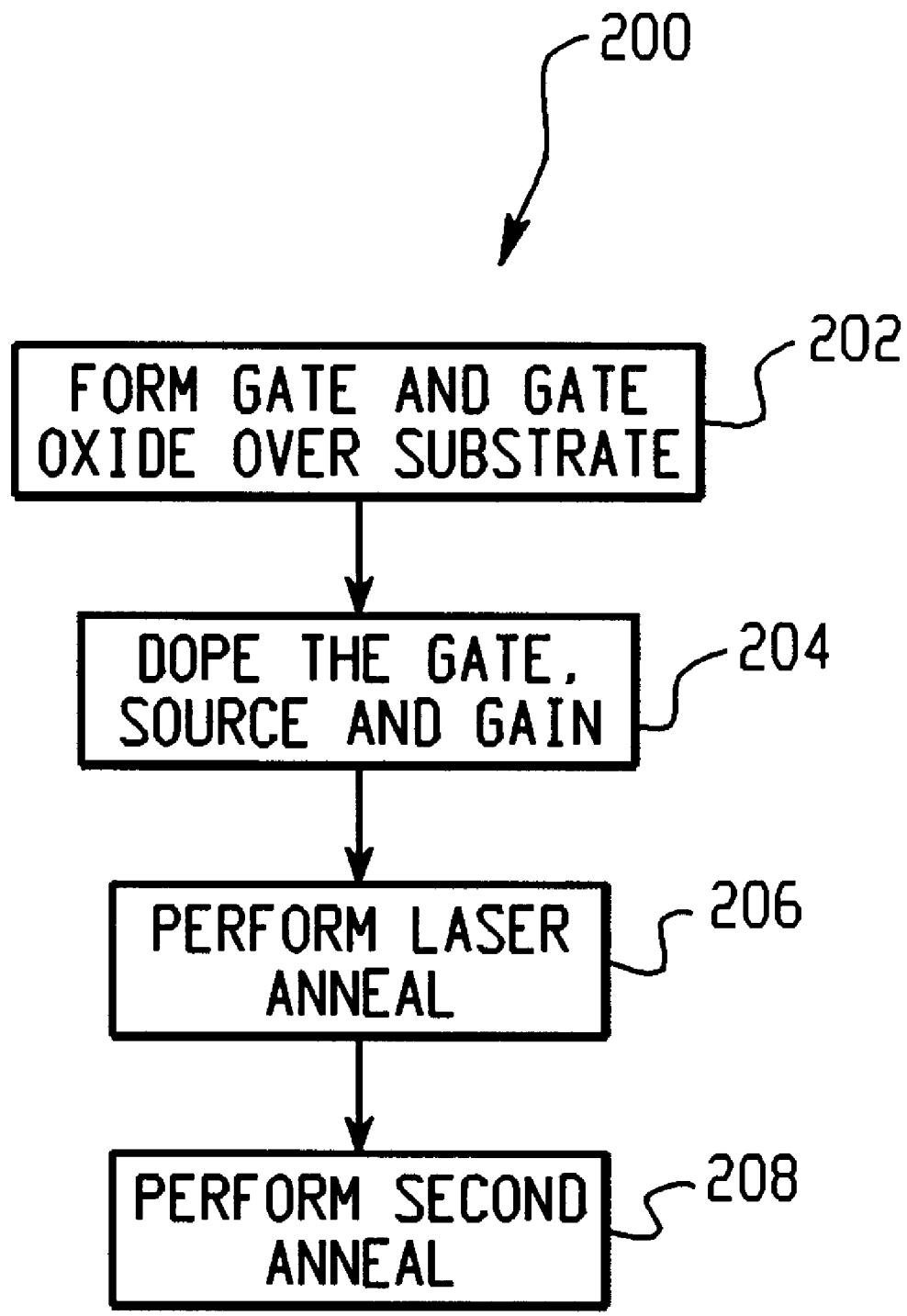
FIG. 3 is a flow chart illustrating manufacturing steps in a method for eliminating poly depletion without impacting the formation of shallow source/drain junctions in accordance with the embodiment of the invention exemplified in FIGS. 2a–2h.

The process for fabricating the transistors of FIGS. 2d and 2h that eliminates poly depletion without adversely impacting the shallow source/drain junctions may be broadly characterized in an integrated circuit manufacturing process 200 as illustrated in FIG. 3. At a step 202, the polysilicon gate 56 is formed on the gate oxide 54 which overlies the substrate 50. At step 204, the polysilicon gate 56, and the regions 90 and 92 are subjected to an impurity dopant introduced into the gate 56 and the source and drain regions 90 and 92. A laser anneal is performed at step 206 at an energy that is sufficient to melt the polysilicon to thereby drive the impurities through a substantial depth of the gate 56. The laser anneal energy of step 206 is not sufficient, however, to melt the unactivated source and drain regions 90 and 92. Shallow source/drain junctions are then formed in a second anneal at step 208; consequently, poly depletion is eliminated without adversely impacting the formation of the shallow source/drain regions. By the above process 200, the design trade-off between poly depletion and shallow source/drain formation is eliminated.

Although the present invention was disclosed using a standard MOSFET device, the present invention is equally applicable to LDD-type devices and other type device structures.

Furthermore, although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a transistor, comprising the steps of:
    forming a gate structure overlying an insulating layer, wherein the gate structure and the insulating layer overlie a substrate, thereby separating the substrate into a first region and a second region with a channel region therebetween;
    doping the gate structure, the first region and the second region with a dopant;
    annealing the doped gate structure with a laser anneal, thereby driving the dopant through a substantial depth of the gate structure; and
    activating the dopant to form a source region in the first region and a drain region in the second region, wherein the dopant is further driven into the gate structure, thereby driving the dopant through substantially the entire depth of the gate structure and substantially eliminating poly depletion.

2. The method of claim 1, wherein doping the gate structure, the first region and the second region comprises the step of subjecting the gate structure and substrate to ion implantation.

3. The method of claim 2, wherein the ion implantation comprises the step of implanting an impurity at a dose of about $1 \times 10^{14}$–$1 \times 10^{15}$ ions/cm$^2$ and an implantation energy of about 1 to 20 keV.

4. The method of claim 1, wherein forming the source and drain regions comprise subjecting the transistor to an anneal, thereby activating the dopant in the first and second regions and further driving the dopant into the gate structure.

5. The method of claim 4, wherein the anneal is a rapid thermal anneal.

6. The method of claim 1, wherein the step of annealing the doped gate structure comprises irradiating the transistor with an excimer laser in a pulsed mode.

7. The method of claim 1, wherein the step of annealing the doped gate structure comprises irradiating the transistor with an excimer laser with a fluence of about 600–900 mJ/cm$^2$.

8. The method of claim 1, wherein the step of annealing the doped gate structure comprises irradiating the transistor with a XeCl laser having a wavelength of 308 nm.

9. A method of forming a transistor, comprising the steps of:
    forming a gate structure overlying an insulating layer, wherein the gate structure and the insulating layer overlie a substrate, thereby separating the substrate into a first region and a second region with a channel region there between;
    depositing a dopant layer over the transistor;
    performing a laser anneal at an energy level sufficient to initiate diffusion of dopant from the dopant layer into the gate structure and prevent substantial diffusion of dopant into the substrate;
    removing the dopant layer;
    doping the first region and the second region, thereby forming an unactivated source region and drain region; and
    performing a second anneal, wherein the unactivated source and drain regions are activated and the dopant in the gate structure further diffuses, thereby driving the dopant through substantially the entire depth of the gate structure and substantially eliminating poly depletion.

10. The method of claim 9, wherein depositing the dopant layer comprises the step of laser doping the transistor.

11. The method of claim 10, wherein the step of laser doping comprises photolytically decomposing dopants from a gas phase.

12. The method of claim 9, wherein performing a laser anneal comprises irradiating the dopant layer with an excimer laser in a pulsed mode.

13. The method of claim 9, wherein performing a laser anneal comprises irradiating the dopant layer with an excimer laser with a fluence of about 600–900 mJ/cm$^2$.

14. The method of claim 9, wherein performing a laser anneal comprises irradiating the dopant layer with a XeCl laser having a wavelength of 308 nm.

15. The method of claim 9, wherein removing the dopant layer comprises washing the transistor.

16. The method of claim 9, wherein doping the first and second regions comprises subjecting the first and second regions to ion implantation.

17. The method of claim 16, wherein the ion implantation comprises the step of implanting an impurity at a dose of about $1 \times 10^{14}$$1 \times 10^{15}$ ions/cm$^2$ and an implantation energy of about 1 to 20 keV.

* * * * *